(12) United States Patent
Suzuki et al.

(10) Patent No.: US 10,271,413 B2
(45) Date of Patent: Apr. 23, 2019

(54) ESD PROTECTION DEVICE

(71) Applicant: TDK CORPORATION, Tokyo (JP)

(72) Inventors: Shingo Suzuki, Tokyo (JP); Takahiro Fujimori, Tokyo (JP); Masaharu Hirakawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 7 days.

(21) Appl. No.: 14/871,086

(22) Filed: Sep. 30, 2015

(65) Prior Publication Data

US 2016/0105947 A1 Apr. 14, 2016

(30) Foreign Application Priority Data

Oct. 8, 2014 (JP) .................................. 2014-207107

(51) Int. Cl.
| | |
|---|---|
| H02H 9/00 | (2006.01) |
| H05F 3/04 | (2006.01) |
| H01T 4/12 | (2006.01) |
| H01C 7/10 | (2006.01) |
| H01C 7/105 | (2006.01) |
| H01C 7/12 | (2006.01) |
| H05K 1/02 | (2006.01) |
| H01C 1/148 | (2006.01) |

(52) U.S. Cl.
CPC .............. *H05F 3/04* (2013.01); *H01C 7/105* (2013.01); *H01C 7/1006* (2013.01); *H01C 7/123* (2013.01); *H01T 4/12* (2013.01); *H01C 1/148* (2013.01); *H05K 1/0259* (2013.01)

(58) Field of Classification Search
CPC ................................... H05F 3/04; H02H 9/04
USPC .......................................... 361/56, 111, 220
See application file for complete search history.

(56) References Cited

U.S. PATENT DOCUMENTS

| | | | |
|---|---|---|---|
| 2009/0067113 A1* | 3/2009 | Urakawa .................. | H01T 4/12 361/220 |
| 2010/0309595 A1 | 12/2010 | Adachi et al. | |
| 2011/0286142 A1* | 11/2011 | Ikeda ...................... | H01L 23/60 361/220 |

(Continued)

FOREIGN PATENT DOCUMENTS

| | | |
|---|---|---|
| CN | 103988380 A | 8/2014 |
| JP | H01-175191 A | 7/1989 |
| JP | 4247581 B2 | 4/2009 |
| JP | 4571164 B2 | 10/2010 |

(Continued)

OTHER PUBLICATIONS

Jul. 22, 2016 Office Action issued in U.S. Appl. No. 14/374,047.

(Continued)

*Primary Examiner* — Thienvu V Tran
*Assistant Examiner* — Lucy M Thomas
(74) *Attorney, Agent, or Firm* — Oliff PLC (57) ABSTRACT

The present invention relates to an electrostatic discharge protection device containing a first insulating substrate and a second insulating substrate; a first opposing electrode and a second opposing electrode which two are disposed between the first insulating substrate and the second insulating substrate; external electrodes connected to the first opposing electrode and the second opposing electrode; and a discharge inducing section disposed apart from the front end of the first opposing electrode and the front end of the second opposing electrode.

7 Claims, 4 Drawing Sheets

(56) References Cited

U.S. PATENT DOCUMENTS

| | | | |
|---|---|---|---|
| 2012/0236450 A1* | 9/2012 | Adachi | H01T 4/12 |
| | | | 361/56 |
| 2012/0300355 A1* | 11/2012 | Umeda | H05K 9/0067 |
| | | | 361/220 |
| 2013/0045438 A1* | 2/2013 | Haba | H01M 4/881 |
| | | | 429/535 |
| 2013/0163130 A1* | 6/2013 | Yamada | H01T 4/12 |
| | | | 361/56 |
| 2014/0177114 A1† | 6/2014 | Otsubo | |
| 2014/0313633 A1 | 10/2014 | Fujimori et al. | |
| 2014/0347779 A1 | 11/2014 | Asakura et al. | |
| 2016/0045978 A1* | 2/2016 | Wang | B23K 11/115 |
| | | | 219/91.2 |

FOREIGN PATENT DOCUMENTS

| | | | |
|---|---|---|---|
| JP | 2011-028968 A | | 2/2011 |
| JP | WO2014141988 | † | 9/2014 |
| WO | 2009/098944 A1 | | 8/2009 |
| WO | 2013/054629 A1 | | 4/2013 |

OTHER PUBLICATIONS

Mar. 19, 2013 International Search Report issued in International Application No. PCT/JP2013/051113.

Mar. 19, 2013 Written Opinion of the Internaitonal Searching Authority issued in International Application No. PCT/JP2013/051113.

\* cited by examiner
† cited by third party

ESD PROTECTION DEVICE

The present invention relates to an electrostatic discharge (ESD) protection device, especially an ESD protection device useful in the application of a high-speed transmission system or the integration with common mode filters.

BACKGROUND

Recently, the downsizing and performance improvement of the electronic devices are under rapid development. Further, the improvement of the transmission speed and the lowering of driving voltage in a circuit component in use progress remarkably as seen in the high-speed transmission systems such as the antenna circuit in the cell phone, the RF module, USB 2.0, and USB 3.0, S-ATA2, HDMI (registered trademark) and the like. Unfortunately, with the downsizing of the electronic device or the lowering of driving voltage of the circuit component, the breakdown voltage of the electronic components which are used in the electronic devices decreases. In this respect, to protect the electronic components from overvoltage becomes an important technical subject, for example, to protect the electronic components against the electrostatic pulses generated when the human body is brought into contact with the terminals of an electronic device.

In the past, in order to protect the electronic components from such electrostatic pulses, a method of providing a ceramic varistor between the ground and a line into which the static electricity enters has generally been used. However, the ceramic varistor usually has a relatively high electrostatic capacity which is the main cause for the deteriorated signal quality when the ceramic varistor is used in the high-speed transmission system. In addition, an ESD protection device having a large electrostatic capacity cannot be used in an antenna circuit or an RF module. In this respect, an ESD protection device with a small electrostatic capacity is required to be developed.

An ESD protection device has been suggested as the ESD protection device having a low electrostatic capacity which is provided with two separately and oppositely disposed electrodes, wherein a composite of a conductive inorganic material and an insulating inorganic material is arranged between the electrodes as a discharge inducing section. Similar to the ceramic varistor, such an ESD protection device is also disposed between the ground and a line into which the static electricity enters. If a much too high voltage is applied, discharge will occur between the electrodes of the ESD protection device and then the static electricity will be introduced into the ground side.

Such an ESD protection device provided with the gap typed electrodes possesses characteristics such as a high insulation resistance, a small electrostatic capacity and a good responsiveness. In another respect, a problem rises that the electrodes and the conductive inorganic material inside the discharge inducing section will agglomerate due to the heat or stress generated during the discharge process to cause a short circuit.

As a technique to inhibit the short circuit derived from discharge process, for instance, Patent Document 1 has disclosed an ESD protection device, wherein a mixture portion is disposed between an opposing portion of the oppositely disposed electrodes and the multilayered ceramic substrate. Such an ESD protection device is disclosed, which have the mixture portion containing a metallic material having a shrinkage behavior during firing that is the same or similar to that of the material for the opposing portion of the oppositely disposed electrodes and also a ceramic material having a shrinkage behavior during firing that is the same or similar to that of the material for the multilayered ceramic substrate.

PATENT DOCUMENT

Patent Document 1: JP-A-4247581

SUMMARY

However, despite of the excellent discharge properties, the ESD protection device described in Patent Document 1 which is provided with opposing electrodes and the mixture portion has a problem with the insulation resistance that the insulation resistance decreases in a short time when the ESD protection device works at a high temperature under an applied voltage, wherein the opposing electrodes are disposed in a void with a gap therebetween and the mixture portion is composed of a ceramic material and a metallic material and is disposed adjacent to the opposing electrodes.

In the prior art, when the ESD protection device works at a high temperature under an applied voltage, dendrites grow between the opposing electrodes to cause a short circuit therebetween so that the insulation resistance decreases within a short time, wherein the growth of dendrites is predicted to be caused by ion migrations.

The present invention is completed in view of the conditions mentioned above and aims to provide an ESD protection device which maintains its effect on ESD protection and will not have its insulation resistance decreased within a short time when it works at a high temperature under an applied voltage.

In order to solve the mentioned technical problem, the ESD protection device of the present invention will be provided with an insulating laminate where a first insulating substrate and a second insulating substrate are stacked, a first opposing electrode and a second opposing electrode disposed oppositely between the first insulating substrate and the second insulating substrate, and a discharge inducing section disposed apart from the front end of the first opposing electrode and the front end of the second opposing electrode.

The present inventors have tested the properties of the ESD protection device with such a configuration. As a result, they have found that the insulation resistance will not decrease within a short time when the ESD protection device works at a high temperature under an applied voltage. The underlying mechanism for the mentioned effect is assumed as follows.

In the ESD protection device of the present invention, the front ends of the opposing electrodes and the discharge inducing section are separated by disposing a gap therebetween. In this way, the short circuit between electrodes caused by the growth of the dendrites can be prevented, wherein the growth of the dendrite is predicted as the result of ion migration. In this respect, a device can be provided whose insulation resistance will not decrease within a short time when it works at a high temperature under an applied voltage.

In order to enhance the effect on ESD protection, it is preferable that the discharge inducing section is disposed apart from the front end of the first opposing electrode and the front end of the second opposing electrode each with a space therebetween having a distance shorter than the distance between the two electrodes. If the distance to separate the discharge inducing section from the front end of the first or the second opposing electrode is set to be shorter than the distance between the two electrodes, the insulation resistance will not decrease within a short time when the ESD protection device works at a high temperature under an applied voltage and further the effect on ESD protection will be improved.

An ESD protection device with an improved effect on ESD protection will be provided by shortening the distance between the electrodes or increasing the content of the metallic material in the mixture portion composed of the ceramic material and metallic material or using the metallic material in the discharge inducing section in the ESD protection device. When the percentage occupied by the conductive inorganic material is increased, the effect on ESD protection will be improved.

With the present invention, an device can be provided whose insulation resistance will not decrease within a short time when it works at a high temperature under an applied voltage.

DETAILED DESCRIPTION OF EMBODIMENTS

Hereinafter, the embodiments of the present invention will be described with reference to the drawings. The same reference number is used for the same element in the drawings, and the repeated descriptions will be omitted. The positional relationship is based on the drawings unless otherwise specified. In addition, the dimensional proportions are not limited to those shown in the drawings. Although the following embodiments are used to describe the examples in the present invention, the present invention is not limited to these embodiments.

Figure 1:
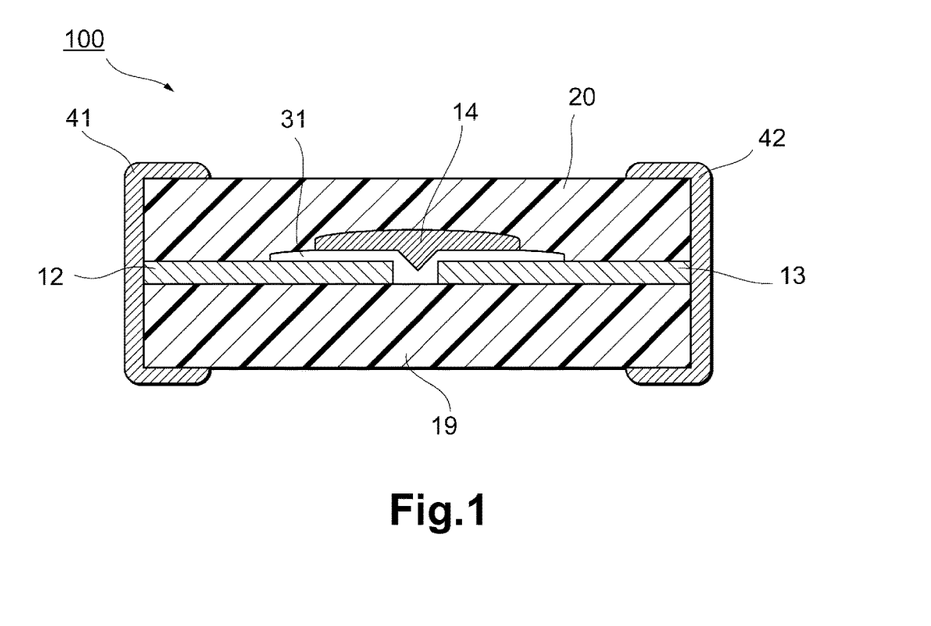
FIG. 1 is a schematic view showing the ESD protection device 100 in the present embodiment. It is a sectional view where the first and the second opposing electrodes 12 and 13 formed on the first insulating substrate are cut from the center.

FIG. 1 is a sectional view schematically showing the ESD protection device 100 in the present embodiment.

The ESD protection device 100 is provided with an insulating laminate having a first insulating substrate 19 and a second insulating substrate 20, a first and a second opposing electrodes 12 and 13 each with a rectangular shape which two are oppositely disposed between the first insulating substrate and the second insulating substrate with a distance ΔG between electrodes, and a discharge inducing section disposed apart from the front end of the first opposing electrode and the front end of the second opposing electrode. The ESD protection device 100 is further provided with external electrodes 41 and 42 respectively electrically connected to the first opposing electrode 12 and the second opposing electrode 13. The ESD protection device 100 is prepared by a laminating manufacturing process in such a manner that the first and the second opposing electrodes 12 and 13 are embedded between the first insulating substrate 19 and the second insulating substrate 20. In addition, in the ESD protection device 100, the opposing electrodes 12 and 13 are electrically connected to external circuits via the external electrodes 41 and 42, and the discharge inducing section 14 is disposed at a site between the first and the second opposing electrodes or somewhere around the site. In this way, when an overvoltage of, for example, static electricity is applied externally, the initial discharge between the first opposing electrode 12 and the second opposing electrode 13 is guaranteed by the discharge inducing section 14.

With respect to the insulating laminate where the first insulating substrate 19 and the second insulating substrate 20 are stacked, its size, shape or the number of the stacked layers in the insulating laminate is not particularly restricted as long as the insulating laminate can support the first opposing electrode 12, the second opposing electrode 13 and the discharge inducing section 14. Here, besides the substrate composed of the insulating material, the insulating laminate may also contain the substrate with an insulating film being formed on part or the whole of its surface. Further, the substrate can be a conductive one with its surface enveloped by an insulating film.

As a specific example of the insulating substrate, for example, a ceramic substrate composed of a material having a dielectric constant of 50 or less, preferably 20 or less such as $Al_2O_3$, $SiO_2$, MgO, AlN, $Mg_2SiO_4$ (forsterite) can be listed.

The first opposing electrode 12 and the second opposing electrode 13 are disposed to be separated from each other on the insulating surface of the first insulating substrate 19. In the present embodiment, the first opposing electrode 12 and the second opposing electrode 13 are disposed with a distance ΔG between them on the first insulating substrate 19. Here, the distance ΔG between electrodes refers to the shortest distance to connect the first opposing electrode 12 and the second opposing electrode 13. In particular, the first insulating substrate is slowly ground from the exterior to expose the interface between the first insulating substrate and each of the electrodes 12 and 13, and then they were observed under an electron microscope and the shortest distance to connect these electrodes is deemed as the distance ΔG between electrodes. If the distance ΔG between electrodes varies based on different positions, the polishing is kept adjusted in directions and observation continues under an electron microscope until the shortest distance to connect the opposing electrodes 12 and 13 is found.

As the material for forming the opposing electrodes 12 and 13, at least one metal selected from the group consisting of C, Ni, Al, Fe, Cu, Ti, Cr, Au, Ag, Pd and Pt or the alloy derived from these metals can be listed. In addition, in the present embodiment, the opposing electrodes 12 and 13 are described to be rectangular in the schematic view of FIG. 2. However, they are not particularly limited to that shape. For instance, they can be comb-like or zigzag.

The distance ΔG between the first opposing electrode 12 and the second opposing electrode 13 is 5 to 40 μm, preferably 8 to 30 μm. When ΔG is less than 5 μm, the initial IR is likely to decrease. On the other hand, when ΔG is higher than 40 μm, the peak voltage increases so that no sufficient effect on ESD protection can be provided in practice.

As for the term "front end of opposing electrode" in the present invention, the portion with a length equal to the thickness of the electrode elongating from the part, with shortest distance between the electrodes, of the opposing electrode towards the side where the external electrode residents is regarded as the "front end of opposing electrode".

The thickness of the electrode refers to the average thickness of the electrode in the sectional view where the first and second opposing electrodes 12 and 13 formed on the first insulating substrate are cut from the center.

Figure 3:
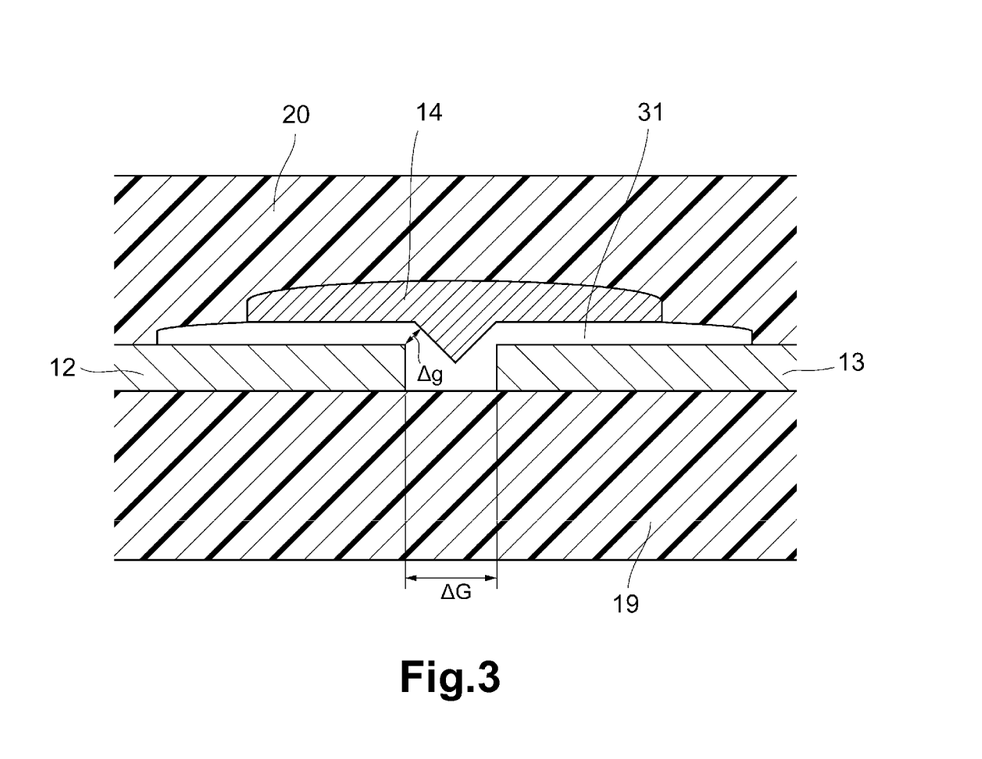
FIG. 3 is a schematic view concerning the ESD protection device 100 in the present embodiment where the part around the center in FIG. 1 has been enlarged.

The discharge inducing section 14 has a convex shape protruding towards the gap between the first opposing electrode 12 and the second opposing electrode 13 as shown in FIG. 1 so that it is disposed apart from the first and the second opposing electrode with a space having a distance shorter than the distance ΔG between the electrodes. In particular, the first insulating substrate is slowly ground from the exterior to expose the interface between the first insulating substrate and each of the electrodes 12 and 13, and then they were observed under an electron microscope. FIG. 3 is a sectional view concerning the ESD protection device 100 of the present embodiment which schematically shows the enlarged part around the center in FIG. 1. The shortest distance between the first opposing electrode 12 and the discharge inducing section is set as Δg1 and the shortest distance between the second opposing electrode 13 and the discharge inducing section is set as Δg2. The shorter one of Δg1 and Δg2 is referred to as the separating distance Δg of the discharge inducing section.

The method for manufacturing the first opposing electrode 12 and the second opposing electrode 13 is not particularly restricted, and the well-known means can be properly selected. In particular, there are the methods for forming the first opposing electrode 12 and the second opposing electrode 13 with a desired thickness on the first insulating substrate 19 such as coating, pattern transferring, electroplating, electroless plating, evaporation or sputtering. In addition, the shape of the opposing electrodes 12 and 13 or the distance ΔG between electrodes can be processed (adjusted) by some well-known methods such as the ion milling, etching, laser processing and cutting. Also, by screen printing using a plate where a pattern has been formed for the gap part between the first opposing electrode 12 and the second opposing electrode 13, the electrode layer is formed on the substrate. After that, by a firing process, the first opposing electrode 12 and the second opposing electrode 13 can be formed. Alternatively, the device can be formed by a laminating manufacturing process with the use of a material where the electrode layer is formed on a green sheet composed of an insulating substance through screen printing.

Figure 2:
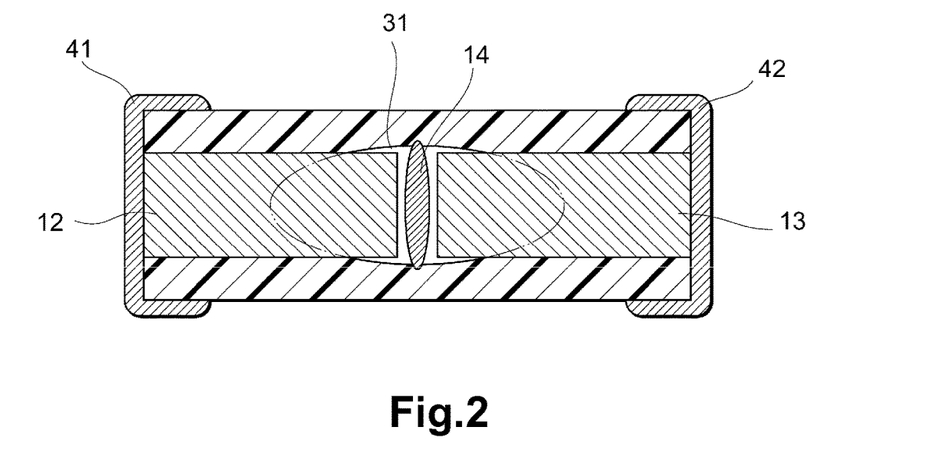
FIG. 2 is a schematic view showing the internal structure of the ESD protection device 100 in the present embodiment.

In the present embodiment, the discharge inducing section 14 consists of a conductive inorganic material or a composite where an insulating inorganic material and an conductive inorganic material disperse therein. FIG. 2 is a view schematically showing the internal structure of the ESD protection device 100 in the present embodiment when viewed from the side where the discharge inducing section 14 residents (i.e., viewed from top in FIG. 1).

Figure 6:
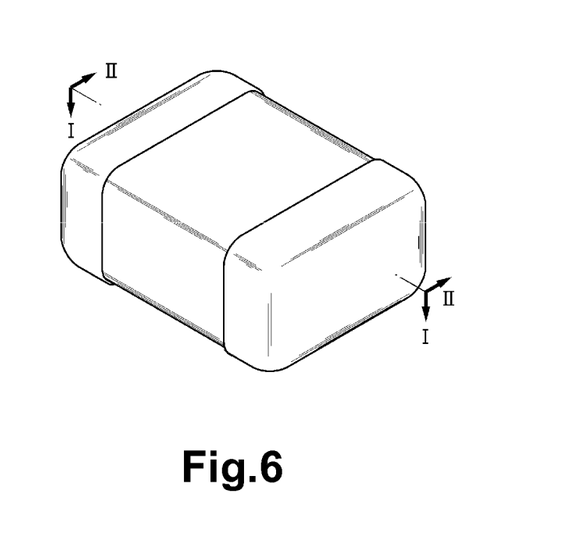
FIG. 6 is a schematic view showing the sections in FIG. 1 and FIG. 2 which both show the internal structure of the ESD protection device 100 in the present embodiment.
Figure 7:
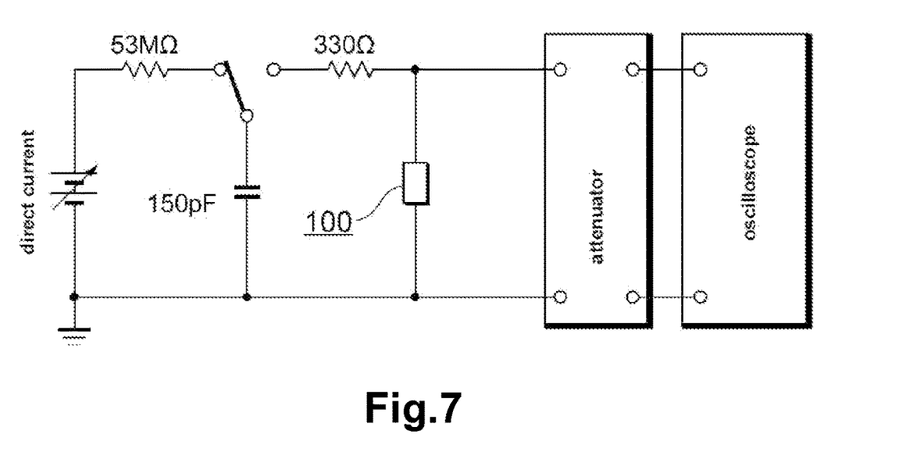
FIG. 7 is a circuit diagram involved in the ESD discharge test.

The shape of the discharge inducing section 14 is not particularly restricted. In the present embodiment (i.e., in FIG. 1), the discharge inducing section 14 has a convex shape protruding towards the gap between the first opposing electrode 12 and the second opposing electrode 13 so that it separates from the front end of either of the first and the second opposing electrodes with a space therebetween having a distance shorter than distance ΔG between the electrodes. In this way, a device can be provided whose effect on ESD protection is kept and meanwhile the insulation resistance will not decrease within a short time when it works at a high temperature under an applied voltage. In addition, the number of the discharge inducing section 14 can be properly set. Several discharge inducing sections can be disposed on the gap. For example, as shown in FIG. 6, two discharge inducing sections 14 with a convex shape can be formed.

In the internal structure when viewed in FIG. 1 from top, the space 31 is not particularly limited in shape. For instance, any shape can be employed such as a rectangular shape, a spherical shape, an ellipse-like shape and an indefinite shape. The space 31 is particularly preferred to have a shape elongating in a direction perpendicular to the direction in which the first opposing electrode 12 and the second opposing electrode 13 are connected. When the space 31 is formed as such, the discharge generated between the first opposing electrode 12 and the second opposing electrode 13 proceeds along the surface of the discharge inducing section. Therefore, the deterioration of the discharge inducing section decreases and the durability is improved. Further, the peak voltage or the discharge starting voltage will decrease and the effect on ESD inhibition will be further improved.

Hereinafter, the preferable method for forming the space 31 and the discharge inducing section 14 will be described. First of all, the paste for the space is prepared and then coated or printed to the gap between the electrodes 12 and 13 to form the space. A mixture containing an insulating inorganic material and a conductive inorganic material is prepared and then coated or printed to the specified position above the paste for the space which is provided to the gap between the first opposing electrode 12 and the second opposing electrode 13 so as to form the discharge inducing section 14. Thereafter, the removable material is thermally decomposed through a firing treatment and then disappears. As such, the removable material is removed during firing, and the space 31 and the discharge inducing section 14 with the desired shapes are obtained at the desired positions. Here, the treatment conditions for the firing process are not particularly limited. If the productivity and the economic issues are to be considered, the firing process is preferably performed at 500 to 1200° C. at an air atmosphere for 10 minutes to 5 hours.

In addition, the removable material used in the method mentioned above is not particularly restricted as long as it will be thermally decomposed during firing. Some well known removable materials can be properly selected. As the specific examples of such removable materials, resin particles or the resin paste which is a mixture of a solvent and a resin can be listed. However, the material is not limited to this. As the representative resin particle, for example, the resin particle with excellent thermal decomposability such as the acrylic resin can be listed. Further, the shape is not particularly restricted for the resin particle. For instance, the shape of the resin particle can be any one of the hammer-like shape, the column-like shape, the sphere-like shape with an aspect ratio of 1 to 5, the ellipsoid-like shape with an aspect ratio above 5 or an indefinite shape. Also, the representative resin paste such as a resin that is thermally decomposed or disappear during the firing process can be, for example, a resin paste obtained by mixing the acrylic resin, ethyl cellulose, polypropylene and the like in a well-known solvent.

Further, the particle size of the resin particle refers to the median particle size (D50) when the resin particle is spherical and also refers to the arithmetic mean of the major axis and the minor axis when the resin particle is in other shapes.

During the preparation of the mixture, various additives such as the solvent or the binder can be added. In addition, various additives such as the solvent, the binder or the like can be added when the mixture is coated or printed. When the resin paste is used to prepare the hollow portions 31a and 31b, the concentration of the solid components, the viscosity and the like of the resin paste can be properly adjusted to provide the hollow portion 31a, 31b with the desired shape and size. Further, when the resin paste is prepared or when the resin paste is coated or printed, various additives such as the solvent, the surfactant, the thickener or the like can be added. On the other hand, a constructed body which is composed of the resin or fiber capable of being thermally decomposed or volatilizing or disappearing during the firing process and also has a shape in accordance with the space 31 having a desired shape and size can be used instead of the removable material or used together with the removable material to prepare the space 31.

In the discharge inducing section composed of the conductive inorganic material and the insulating inorganic material, it is preferable that the conductive inorganic material is comprised in a proportion of 10 vol % or more. The effect on electrostatic inhibition can be improved by increasing the percentage of the conductive inorganic material. Maximum, 100 vol % of conductive inorganic material can be contained. However, the discharge inducing section exposed to discharges in the test concerning discharge durability is likely to be scattered and IR is likely to decrease. Thus, in order to improve durability against repeated uses, the discharge inducing section is more preferred to be composed of the conductive inorganic material and the insulating inorganic material.

As the specific examples of the conductive inorganic material to form the discharge inducing section, for instance, the metal, the alloy, the metallic carbide, the metallic boride and the like can be listed. However, the material is not particularly limited thereto. If the conductivity is to be considered, C, Ni, Al, Fe, Cu, Ti, Cr, Au, Ag, Pd and Pt or the alloy thereof are preferred.

The specific example of the insulating inorganic material for forming the discharge inducing section can be, for example, the metallic oxide, the metallic nitride such as AlN and the like. However, the material is not limited thereto. If the insulation properties or the costs are to be considered, $Al_2O_3$, SrO, CaO, BaO, $TiO_2$, $SiO_2$, ZnO, $In_2O_3$, NiO, CoO, $SnO_2$, $Bi_2O_3$, $Mg_2SiO_4$, $V_2O_5$, CuO, MgO, $ZrO_2$, $Mg_2SiO_4$, AlN, BN and SiC are preferable. These compounds can be used alone. Alternatively, two or more of them can be used in combination. Among those, $Al_2O_3$, $SiO_2$ $Mg_2SiO_4$ or the like are more preferable from the viewpoint of good insulation properties.

Various modifications are possible as long as they do not depart from the spirit of the present invention, and the present invention is not limited to the foregoing embodiments.

EXAMPLES

Hereinafter, the embodiments of the present invention will be described with reference to FIG. 1 and FIG. 2 which are the schematic views for Examples and Comparative Examples.

First of all, the influence of the presence of the insulating layer or the type of the insulating inorganic material contained in the insulating layer on the durability against repeated uses was tested.

Example 1

First of all, a green sheet obtained by making the materials consisting of $Al_2O_3$ and the glass component as the main component into a sheet was prepared as an insulating substrate. An Ag paste was printed to have a thickness of about 10 μm after firing on one surface of the green sheet through screen printing so as to form a pair of oppositely disposed trip-like patterns for the first opposing electrode 12 and the second opposing electrode 13. The printing was performed in such a manner that the length and the width of the electrodes 12 and 13 and the distance ΔG between electrode would respectively be 0.5 mm, 0.4 mm and 30 μm after the firing process.

Then, the acrylic resin was mixed in butyl carbitol to prepare the paste-like mixture for space formation having a solid content of 40 mass %.

The resultant paste-like mixture was formed on the first insulating substrate 19, the first opposing electrode 12 and second opposing electrode 13 to cover the insulating surface of the first insulating substrate 19 and part of the surfaces of the opposing electrodes 12 and 13.

Then, the discharge inducing section 14 was formed above the space 31 in the order shown below. Firstly, $Al_2O_3$ with an average particle size of 1 μm (product number: AM-27, prepared by Sumitomo Chemical Co., Ltd) was weighed as the insulating inorganic material to occupy 70% of the volume, and Ag particles with an average size of 1 μm (product number: SPQ05S, prepared by Mitsui Mining & Smelting Co., Ltd) was weighed as the conductive inorganic material to occupy 30% of the volume. They were mixed to provide a mixture. On the other hand, the ethyl cellulose based resin as the binder was mixed with terpineol as the solvent to prepare a lacquer with a solid concentration of 8 mass %. Then, the lacquer was added to and mixed with the mixture obtained above to prepare the paste for the discharge inducing section.

Then, the obtained paste-like mixture was coated by screen printing on the precursor of the space 31 to form a mixture layer (the precursor of the discharge inducing section 14). Further, the green sheet was stacked on the mixture layer to provide a laminate through hot pressing. Thereafter, the obtained laminate was cut into individual pieces with a specified size. Then, the individual pieces of laminate were subjected to an hour of thermal treatment (treatment to remove binder) at 200° C. Then, the temperature was raised with a rate of 10° C./min and the individual pieces of laminate were kept in air at 950° C. for 30 minutes to provide a sintered body.

Then, an external electrode with Ag as the main component was formed to be connected to the exterior ends of the first opposing electrode 12 and the second opposing electrode 13. In this way, the ESD protection device 100 of Example 1 was provided.

Example 2

An ESD protection device in Example 2 was prepared as in Example 1 except the insulating inorganic material for forming the discharge inducing section 14 was weighed to occupy 90% of the volume and the conductive inorganic material was weighed to occupy 10% of the volume.

Example 3

An ESD protection device in Example 3 was prepared as in Example 1 except the insulating inorganic material for forming the discharge inducing section 14 was weighed to occupy 50% of the volume and the conductive inorganic material was weighed to occupy 50% of the volume.

Example 4

An ESD protection device in Example 4 was prepared as in Example 1 except only the conductive inorganic material was used to form the discharge inducing section 14.

Example 5

An ESD protection device in Example 5 was prepared as in Example 1 except the design was changed for the screen in the screen printing process and two mixture layers (the precursor of the discharge inducing section 14) were formed in the formation of the discharge inducing section 14.

Example 6

An ESD protection device in Example 6 was prepared as in Example 1 except that the central part of the electrode was cut and processed through YAG laser after a pair of strip-like electrode patterns were formed during the formation of the patterns of the first opposing electrode 12 and the second opposing electrode 13 to form the first opposing electrode 12 and the second opposing electrode 13, and the width of laser processing was adjusted in such a manner that the distance ΔG between the first opposing electrode 12 and the second opposing electrode 13 turned to 20 μm after firing.

Example 7

An ESD protection device in Example 7 was prepared as in Example 1 except that the first opposing electrode 12 and the second opposing electrode 13 were screen printed in such a manner that the distance ΔG between the opposing electrodes turned to 40 μm after firing.

Comparative Example 1

Figure 4:
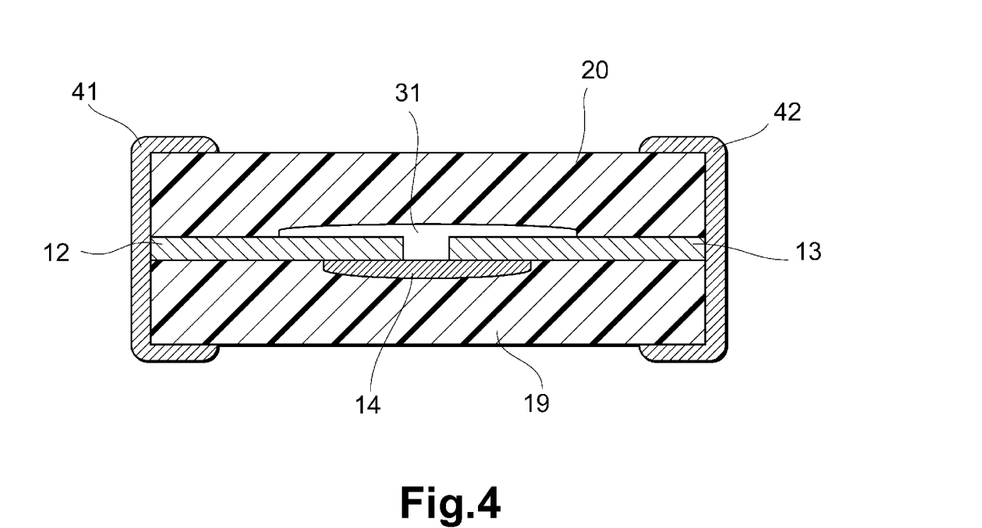
FIG. 4 is a schematic view showing the internal structure of the ESD protection device in Comparative Example 1.
Figure 5:
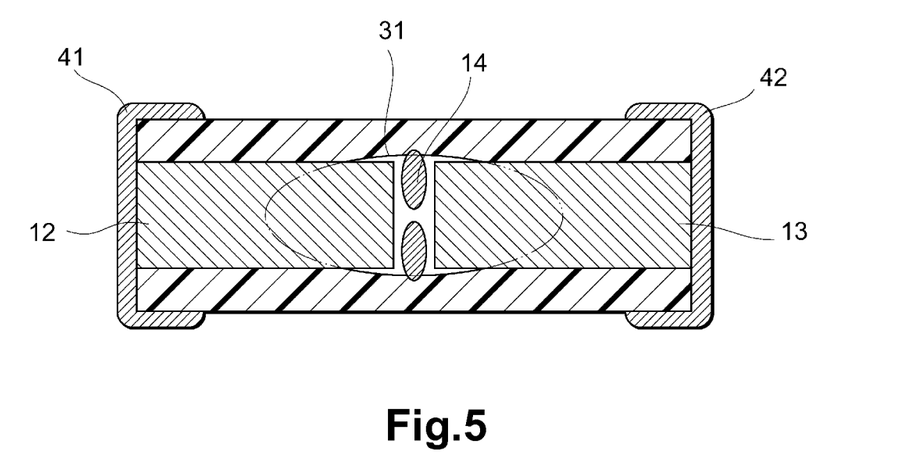
FIG. 5 is a schematic view showing the internal structure of the ESD protection device in Example 5.

An ESD protection device of Comparative Example 1 as shown in FIG. 4 was prepared as in Example 1 with modifications as follows. First of all, a mixture layer (the precursor of the discharge inducing section 14) was formed through screen printing on one surface of the insulating substrate and Ag paste was screen printed on the mixture layer so as to form the patterns of the opposing electrodes 12 and 13.

Then, the paste for space formation was formed on the first opposing electrode 12 and the second opposing electrode 13 to cover part of the surfaces of the first opposing electrode 12 and the second opposing electrode 13.

<Electrostatic Discharge Test>

The electrostatic discharge test was performed on the ESD protection devices of Examples 1 to 5 and Comparative Example 1 obtained above by using the circuit for electrostatic discharge test as shown in FIG. 3. The test results were shown in Table 1.

The electrostatic discharge test was carried out based on the human body model (discharge resistance was 330Ω, discharge capacitance was 150 pF, applied voltage was 8.0 kV, contact discharge) following the IEC61000-4-2 electrostatic discharge immunity test and the noise test. In particular, as shown in the circuit for electrostatic test in FIG. 3, one external electrode of the ESD protection device as the evaluation subject was connected to the ground while the other external electrode was connected to the electrostatic pulse applying portion so that the electrostatic pulses were applied when the electrostatic pulse applying portion contacted the discharge gun. One hundred samples for each Example were prepared for the electrostatic discharge test, and the electrostatic discharge test was done in each sample with a voltage of 8.0 kV. The discharge properties were assessed according to the peak voltage in the discharge test. As for the high temperature load test, the sample was kept in a thermostatic bath set as 100° C. under an applied voltage of 10 V. The time, at which the insulation resistance (IR) became $10^2 \Omega$ or less and the insulation properties had deteriorated, was deemed as the broken-down time, and the average was deemed as the average broken-down time.

The method for evaluating the results from the electrostatic discharge test was described here. Grade A was assigned to the sample with a peak voltage of 500 V or lower in the discharge test and Grade B was assigned to the sample with a peak voltage of 500 V or higher.

Then, the method for evaluating the results from the high temperature load test was described here. Grade A was assigned to the sample with an average broken-down time of 500 h or longer and Grade B was assigned to the sample with an average broken-down time of 100 h or longer. In addition, Grade C was assigned to the sample with an average broken-down time of 100 h or shorter.

TABLE 1

| | Separating distance Δg (μm) | Distance between electrodes ΔG (μm) | Amount of conductor (vol %) | Peak voltage (V) Ave. | Evaluation | IR (Ω) Min. | Average broken-down time in high temperature load (hour) | Evaluation |
|---|---|---|---|---|---|---|---|---|
| Example 1 | 7.3 | 30 | 30 | 563 | B | $10^{11}$ | 632 | A |
| Example 2 | 6.9 | 30 | 10 | 941 | B | $10^{11}$ | 1231 | A |
| Example 3 | 7.1 | 30 | 50 | 459 | A | $10^{11}$ | 411 | B |
| Example 4 | 8.1 | 30 | 100 | 234 | A | $10^{11}$ | 132 | B |
| Example 5 | 8.5 | 30 | 30 | 651 | B | $10^{11}$ | 805 | A |
| Example 6 | 5.5 | 20 | 30 | 492 | A | $10^{11}$ | 482 | B |
| Example 7 | 10 | 40 | 30 | 677 | B | $10^{11}$ | 890 | A |
| Comparative Example 1 | 0 | 30 | 30 | 251 | A | $10^{11}$ | 18 | C |

It could be confirmed from Table 1 that the ESD protection devices in Examples 1 to 7 had a low peak voltage so their effects on ESD protection were excellent and broken-down is difficult to happen in high temperature load.

On the other hand, it was known from Table 1 that the ESD protection device in Comparative Example 1 had a low peak voltage. The effect on ESD protection was excellent but the average broken-down time was short in high temperature load, suggesting that a short circuit caused by the ion migration was likely to happen.

As described above, the ESD protection device of the present invention keeps its effect on ESD protection and its insulation resistance will not decrease within a short time when it works at a high temperature under an applied voltage. Therefore, the ESD protection device of the present invention can be widely and effectively used in electric or electrical devices having these properties and various machines, equipments and systems containing these electric or electrical devices.

DESCRIPTION OF REFERENCE NUMERALS 12,13 first and second opposing electrodes
14 discharge inducing section
19 first insulating substrate
20 second insulating substrate
31 space
41 external electrode
42 external electrode
100 ESD protection device

What is claimed is:

1. An electrostatic discharge protection device comprising:
   a first insulating substrate and a second insulating substrate;
   a first opposing electrode and a second opposing electrode which are disposed between the first insulating substrate and the second insulating substrate;
   external electrodes connected to the first opposing electrode and the second opposing electrode; and
   a discharge inducing section (a) disposed between the first insulating substrate and the second insulating substrate, (b) being spaced from the first opposing electrode and the second opposing electrode and (c) having a protrusion between the first and second opposing electrodes;
   wherein:
   there is a space between the protrusion and the first and second opposing electrodes that contains only air;
   there is a gap between the first opposing electrode and the second opposing electrode;
   the protrusion protrudes into the gap;
   the protrusion begins above the gap between the first opposing electrode and the second opposing electrode; and
   the width of the protrusion above the gap between the first opposing electrode and the second opposing electrode is greater than the width of the protrusion in the gap between the first opposing electrode and the second opposing electrode.

2. The electrostatic discharge protection device of claim 1, wherein,
   the first opposing electrode includes a front end opposing the second opposing electrode;
   the second opposing electrode includes a front end opposing the first opposing electrode; and
   when the shortest distance between the first opposing electrode and the second opposing electrode is regarded as AG and the shortest distance between the front end of either opposing electrode and the discharge inducing section is regarded as $\Delta g$, $\Delta G$ is longer than $\Delta g$.

3. The electrostatic discharge protection device of claim 1, wherein,
   the discharge inducing section consists of an conductive inorganic material, or
   the discharge inducing section comprises an insulating inorganic material and a conductive inorganic material and the conductive inorganic material is comprised in a proportion of 10 vol % or more.

4. The electrostatic discharge protection device of claim 2, wherein,
   the discharge inducing section consists of an conductive inorganic material, or
   the discharge inducing section comprises an insulating inorganic material and a conductive inorganic material and the conductive inorganic material is comprised in a proportion of 10 vol % or more.

5. The electrostatic discharge protection device of claim 1, wherein the shortest distance between the protrusion and each of the first and second opposing electrodes is less than the shortest distance between the first opposing electrode and the second opposing electrode.

6. The electrostatic discharge protection device according to claim 5, wherein there is no structure between the protrusion and the first and second opposing electrodes.

7. The electrostatic discharge protection device according to claim 1, wherein:
   the discharge inducing section includes a first portion that extends above and over the first opposing electrode and the second opposing electrode; and
   the protrusion extends from the first portion.

* * * * *